US011871547B2

(12) United States Patent
Gao (10) Patent No.: US 11,871,547 B2
(45) Date of Patent: Jan. 9, 2024

(54) TWO PHASE SYSTEM FOR ENCLOSURE SYSTEMS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 224 days.

(21) Appl. No.: 17/465,122

(22) Filed: Sep. 2, 2021

(65) Prior Publication Data

US 2023/0065556 A1  Mar. 2, 2023

(51) Int. Cl.
*H05K 7/20* (2006.01)
*G01M 3/02* (2006.01)

(52) U.S. Cl.
CPC ........ *H05K 7/20836* (2013.01); *G01M 3/02* (2013.01); *H05K 7/20327* (2013.01); *H05K 7/20818* (2013.01)

(58) Field of Classification Search
CPC ......... H05K 7/20781; H05K 7/20272; H05K 7/20772; H05K 7/20327; H05K 7/20836; H05K 7/20809; H05K 7/20818; H05K 7/20254; H05K 7/20318; H05K 7/20309; H05K 7/208; H05K 7/20727; H05K 7/1487; H05K 7/1489; H05K 7/2029; H05K 7/20; F28F 9/26; F28F 2265/16; G06F 1/20; G06F 2200/201; G06F 15/161
USPC ..... 361/679.53, 699, 700, 725, 702, 679.46, 361/715; 165/104.33, 80.4, 104.21, 244; 257/714
See application file for complete search history.

(56) References Cited

U.S. PATENT DOCUMENTS

| | | | |
|---|---|---|---|
| 7,318,322 B2 * | 1/2008 | Ota | H05K 7/20781 62/305 |
| 10,133,698 B2 | 11/2018 | Shao et al. | |
| 10,785,892 B1 * | 9/2020 | Chen | H05K 7/20281 |
| 11,231,756 B2 * | 1/2022 | Nakamura | H05K 7/20272 |
| 11,452,241 B2 | 9/2022 | Tufty et al. | |
| 2004/0008483 A1 * | 1/2004 | Cheon | G06F 1/20 361/699 |
| 2006/0203433 A1 | 9/2006 | Peterson et al. | |
| 2007/0187343 A1 | 8/2007 | Colucci et al. | |
| 2014/0002988 A1 | 1/2014 | Roesner et al. | |
| 2014/0078675 A1 | 3/2014 | Chainer et al. | |

(Continued)

*Primary Examiner* — Mandeep S Buttar
(74) *Attorney, Agent, or Firm* — WOMBLE BOND DICKINSON (US) LLP (57) ABSTRACT

A coolant management unit includes a server supply manifold, a server return manifold, a power distribution, and a controller. A server supply manifold is to receive cooling fluid from a cooling fluid source. The server supply manifold is to distribute the cooling fluid to server blades. The server return manifold is to receive vapor from the one or more server blades. The cooling fluid is two-phase cooling fluid to extract heat from one or more servers and to evaporate into the vapor into the server return manifold, and the vapor is transmitted to an external condenser via the rack return manifold to be condensed back to a liquid form. A power distribution bus is configured to distribute power to the one or more servers. A controller is configured to control a fluid pump coupled to the server supply manifold based on one or more signals received from different sensors.

20 Claims, 6 Drawing Sheets

(56) References Cited

U.S. PATENT DOCUMENTS

| | | | |
|---|---|---|---|
| 2014/0085821 A1* | 3/2014 | Regimbal | H05K 7/207 |
| | | | 361/699 |
| 2014/0247540 A1 | 9/2014 | Steeves et al. | |
| 2017/0290202 A1* | 10/2017 | Shah | G06F 1/1632 |
| 2017/0325358 A1* | 11/2017 | Franz | H05K 7/20781 |
| 2017/0339804 A1 | 11/2017 | Ingalz et al. | |
| 2018/0299933 A1* | 10/2018 | Cui | H05K 7/20772 |
| 2019/0044809 A1 | 2/2019 | Willis et al. | |
| 2019/0090383 A1 | 3/2019 | Tufty et al. | |
| 2019/0182990 A1* | 6/2019 | Chen | H05K 7/20736 |
| 2019/0335606 A1 | 10/2019 | James et al. | |
| 2020/0106297 A1 | 4/2020 | Ross | |
| 2021/0307210 A1* | 9/2021 | Wong | H05K 7/20327 |
| 2021/0410336 A1 | 12/2021 | Yao et al. | |
| 2022/0240421 A1* | 7/2022 | Zhang | G06F 1/20 |
| 2022/0354026 A1* | 11/2022 | Kelley | H05K 7/20818 |

* cited by examiner

TWO PHASE SYSTEM FOR ENCLOSURE SYSTEMS

FIELD OF THE INVENTION

Embodiments of the present invention relate generally to the server and rack design, cooling hardware, two phase cooling, cooling system, two-phase immersion system. More particularly, embodiments of the invention relate to a two-phase system for enclosure blade systems.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

The previous solutions for thermal management design for servers are air cooling based, however, the shortfall is that this solution may not satisfy for high power density systems thermal management since air cooling may reach a limitation for high heat density systems.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures.

The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architectures.

The present disclosure aims to provide a design and system for two-phase cooled blade servers. The present disclosure also can be used for designing thermal management solutions for liquid cooled nodes which are populated in parallel on the rack. This design aims to solve two-phase based high power density blade servers' thermal management challenges as well as hyper scale deployment challenge. In addition, the following items serve as additional challenges that the present disclosure aims to solve: high power density servers; high efficiency operation and management; enable two phase thermal management technology; efficient two phase coolant management; designed for high variations in both the cooling capacity and heat load generations; modular design for easy configurations for accommodating different use cases; accommodate different rack architectures; cooling capacity reconfigurable; built in control strategy for fluid management as well as optimization; and accommodate different facility architectures.

In addition, the present disclosure also aims to enable to design high heterogeneous rack system with different blade servers coexisting on a single rack for edge computing applications.

The present application includes a coolant management unit, also referred to as a two-phase module (TPM), which is used for adapting a blade IT system and a rack system. In an embodiment, the two-phase/coolant management unit includes single-phase and two-phase coolant management manifolds and the manifolds are assembled with sub-ports and ports on the opposite sides. In an embodiment, the sub-ports are designed for individual blade servers and an opposite port is for connecting with the main source, including the rack liquid supply manifold and rack main return manifold. In an embodiment, the power distribution bus is integrated within the module. In an embodiment, a built-in controller is used for operating the fluid pump assembled between the rack liquid supply manifold and the server supply manifold. For example, there are three types of sensors which are the pressure sensor, power meter and leakage detection sensor which are used for controller to adjust the operation of the pump. In addition, in an embodiment, the controller includes a communication port used for connecting with the rack management controller (RMC) which receives individual server internal temperature.

In an embodiment, the coolant management unit includes a server supply manifold, a server return manifold, a power distribution bus, and a controller. In an embodiment, a server supply manifold is to be coupled to a rack supply manifold to receive cooling fluid from a cooling fluid source. The server supply manifold is to distribute the cooling fluid to one or more server blades of the server chassis. The coolant management unit is positioned on a rear side of the server chassis.

In an embodiment, a server return manifold is to be coupled to a rack return manifold. In an embodiment, the server return manifold is to receive vapor from the one or more server blades. The cooling fluid is two-phase cooling fluid to extract heat from one or more servers and to evaporate into the vapor into the server return manifold. /The vapor is transmitted to an external condenser via the rack return manifold to be condensed back to a liquid form.

In an embodiment, a power distribution bus is configured to distribute power to the one or more servers. A controller is configured to control a fluid pump coupled to the server supply manifold based on one or more signals received from one or more sensors. For example, the one or more sensors include a pressure sensor coupled to the server return manifold. The sensors include a leakage sensor to detect leakage. In an embodiment, the one or more sensors include a pressure sensor coupled to the server return manifold. In an embodiment, the one or more sensors include one or more temperature sensors to measure corresponding server temperature.

In an embodiment, the controller is coupled to a communication port connected with a rack management controller (RMC). In an embodiment, the RMC receives information of the corresponding server temperature from the controller.

In an embodiment, the server supply manifold includes a liquid port connected with the rack supply manifold. The server supply manifold includes one or more liquid sub-ports connected with corresponding liquid ports of the one or more server blades. The server return manifold includes a vapor port connected with the rack return manifold.

In an embodiment, the server return manifold includes one or more vapor sub-ports connected with corresponding vapor ports of the one or more server blades. In an embodiment, the server return manifold is disposed above the server supply manifold.

In an embodiment, the power distribution bus is positioned under the server return manifold. In an embodiment, the server supply manifold is positioned under the power distribution bus. In an embodiment, the coolant management unit includes a first blocking panel, a second blocking panel and a third blocking panel to prevent impact from leaked fluid.

In an embodiment, the first blocking panel is on the top of the coolant management unit, wherein the first blocking panel is inserted into the server chassis to prevent and segregate any of the leaked fluid from the top. In an embodiment, the second blocking panel is positioned between the power distribution bus and the server supply manifold to segregate any leakage from connectors with the power distribution hardware. In an embodiment, wherein the third blocking panel is on the bottom of the coolant management unit, wherein the third blocking panel is inserted into the server chassis to prevent internal leaked fluid traveling outside.

According to another aspect, a server chassis includes one or more server blades connected with a coolant management unit. For example, the coolant management unit for connecting the server chassis for liquid cooling further includes a server supply manifold, a server return manifold, a power distribution bus, and a controller, as described above.

According to a further aspect, an electronic rack includes a plurality of server chassis arranged in a stack, each server chassis to receive one or more server blades; and a plurality of coolant management units corresponding to the plurality of server chassis for connecting the plurality of server chassis for liquid cooling. In an embodiment, each coolant management unit further includes a server supply manifold, a server return manifold, a power distribution bus, and a controller, as described above.

Figure 1:
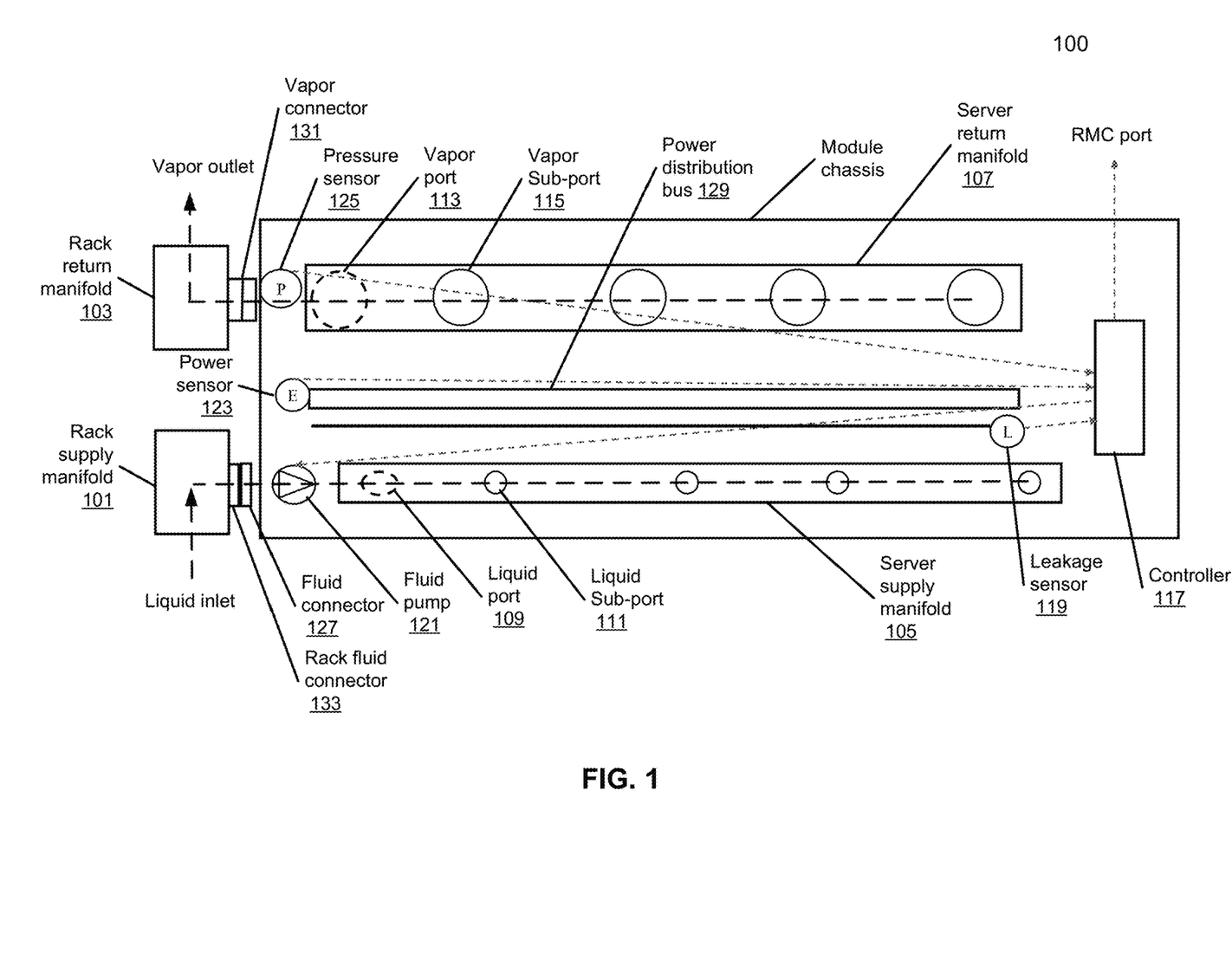
FIG. 1 shows a front view of a two-phase module design according to an embodiment of the application.

FIG. 1 shows a front view of a coolant management unit 100 according to an embodiment of the application. In an embodiment, the rack supply manifold 101 and the rack return manifold 103 are rack based units which are not considered as the coolant management unit (also referred to as a two phase module or TPM). In particular, FIG. 1 shows the design of the coolant management unit (i.e., two-phase module). For example, the two-phase module functions as a rack mounted unit for managing and distributing cooling source and power to the individual blade servers. In an embodiment, the design may have more than one TPMs populated on the rack for different stacks of blade servers. The coolant management unit can be mounted on an electronic rack and includes a rack interface connected to rack manifolds via flexible hoses. The server side, the coolant management unit includes various server interfaces, such as blind mated dripless connectors, which can be used to connect with the cooling modules of server blades of a server chassis.

The coolant is supplied to the cooling devices of a server blade via the server supply manifold of the coolant management unit. A cooling device can be a cold plate attached to an electronic device (e.g., a processor) to extract the heat generated from the electronic device. When the temperature of the coolant arises above a predetermined threshold (e.g., its corresponding boiling point), the coolant transforms from a liquid form into a vapor. The vapor then exits the cooling devices of the server blade into the server return manifold of the cooling management unit.

In an embodiment, referring to FIG. 1, the internal design of the TPM/coolant management unit includes three systems, which are the fluid system, power system and control system. In an embodiment, for the fluid system, the key units are the vapor return manifold (i.e., server return manifold 107) and the supply manifold (i.e., server supply manifold 105). For example, on the two manifolds (105, 107), the connectors are attached onto them. In an embodiment, there are sub-vapor ports (e.g., 115) on one side, and there is a vapor port 113 on the other side of the vapor return manifold 107.

In an embodiment, for supply manifold 105, the liquid sub-ports (e.g., 111) are on one side (e.g., the side facing the frontend of the rack), which can be used to connect with one or more server blades inserted from the frontend of the rack. The opposite side (e.g., the side facing the backend of the rack) includes liquid port or connector 109, which can be connected to rack supply manifold 101, for example, via a flexible hose. In an embodiment, the sub-vapor ports (e.g., 115) and liquid sub-ports (e.g., 111) are facing the frontend of the rack where the server blades will be inserted. In an embodiment, these ports or connectors are used for connecting with the corresponding ports or connectors on the server blades.

In an embodiment, server return manifold 107 includes a vapor port or connector 113 that can be used to connect with rack return manifold 103. Server return manifold 107 includes an array of vapor sub-ports or connectors, such as sub-ports 115. The sub-ports can be used to connect with the server blades to receive the coolant in the form of vapor from the cooling modules (e.g., cold plates) of the server blades. In an embodiment, vapor port 113 is disposed on the side of the coolant management unit that faces the backend of the rack, while the sub-ports are disposed on the opposite side (e.g., the side facing the frontend of the rack). The liquid sub-ports and vapor sub-ports may be implemented using blind mated dripless connectors, such that, a server blade can slide into and remove from a corresponding server slot to connect with or disconnect from the coolant management unit.

In an embodiment, the connection of the vapor port 113 and the main return (i.e., rack return manifold 103) are through a manual mating connector, for example, using flexible hoses. In an embodiment, the connection of the liquid port 109 and the liquid supply (i.e., rack supply manifold 101) are through a manual mating connector, for example, using flexible hoses. In addition, in an embodiment, a pressure sensor 125 is used on the loop between the main return (i.e., rack return manifold 103) and the vapor port 113. In an embodiment, a liquid pump 121 is assembled between the liquid supply (i.e., rack supply manifold 101) and the liquid port 109. In an embodiment, the main return 103 and liquid supply 101 are the two units will be added to the coolant management unit in one design. In an embodiment, these two units are on one side of the coolant management unit and it is designed only to be added to the rack once the coolant management units are populated. In another embodiment, it can be seen that these two units do not included as coolant management unit.

In an embodiment, the coolant management unit further includes a power distribution bus 129, which is used for providing power to the individual blade nodes. In an embodiment, the power distribution bus 129 includes a main power connector to receive power a rack power distribution bus mounted on the rack. Power distribution bus 129 further includes an array of server power connectors to distribute the power to the server blades. In an embodiment, a power sensor 123 annotated as "E" are added on the system as well. The power sensor 123 is used to detect whether power has been receive and sufficient to provide power to other components in the server chassis.

In an embodiment, the controller 117 inside the coolant management unit is used for controlling the fluid pump 121 mainly. For example, the controller 117 receives signals from the pressure sensor 125, power sensor 123 as well as the leakage sensor 119 to control the operation of the pump 121, including the operating speed as well as on and off of pump 121. In addition, is the coolant management unit further includes a communication port coupled with controller 117, which allows controller 117 to communicate with a rack manage controller (RMC) of the rack, such as, for example, determining the temperatures of the corresponding server blade.

It should be noted that the current design shows a rear view of the coolant management unit, however, the actual layout may not represent the actual unit corresponding locations. For example, FIG. 1 only represents the system schematic design. That is, the detailed location of each of the unit may be different as shown in FIG. 1. For example, FIG. 1 shows the return manifold 103 is above the supply manifold, however, the actual product may consider the return manifold 103 located directly on top of the supply manifold 101 from a top view.

In an embodiment, a coolant management unit is positioned on a rear side of the server chassis for connecting a server chassis for liquid cooling. Further in an embodiment, a coolant management unit includes a server supply manifold 105, a server return manifold 107, a power distribution bus 129, and a controller 117.

In an embodiment, a server supply manifold 105 is coupled to a rack supply manifold 101 to receive cooling fluid from a cooling fluid source. For example, the server supply manifold 105 is to distribute the cooling fluid to one or more server blades of the server chassis.

In an embodiment, a server return manifold 107 to be coupled to a rack return manifold 103. For example, the server return manifold 107 is to receive vapor from the one or more server blades. Further, in an embodiment, the cooling fluid is two-phase cooling fluid to extract heat from one or more servers and to evaporate into the vapor into the server return manifold 107. Further, in an embodiment, the vapor is transmitted to an external condenser via the rack return manifold 103 to be condensed back to a liquid form. In an embodiment, a power distribution bus 129 is to distribute power to the one or more servers.

In an embodiment, a controller 117 to control a fluid pump 121 coupled to the server supply manifold 105 based on one or more signals received from one or more sensors (e.g., 119, 123, 125). For example, the one or more sensors include a pressure sensor 125 coupled to the server return manifold 107 to detect the pressure level of the vapor. The sensors may include a leakage sensor 119 to detect leakage. The sensors may include a power sensor 123 coupled to the power distribution bus 129. The sensors may further include one or more temperature sensors to measure corresponding server temperature.

In an embodiment, the controller 117 is coupled to a communication port connected with a rack management controller (RMC). For example, the RMC receives information of the corresponding server temperature from the controller 117.

In an embodiment, the server supply manifold 105 includes a liquid port 109 connected with the rack supply manifold 101. In an embodiment, the server supply manifold 105 includes one or more liquid sub-ports 111 connected with corresponding liquid ports of the one or more server blades. In an embodiment, the server return manifold 107 includes a vapor port 113 connected with the rack return manifold 103. In an embodiment, the server return manifold 107 includes one or more vapor sub-ports 115 connected with corresponding vapor ports of the one or more server blades. In an embodiment, the fluid pump 121 is connected to the liquid port 109, and the other end of the fluid pump loop is equipped with a fluid connector 127 for connecting with the rack fluid connectors 133 on the rack supply manifold 101. In an embodiment, the pressure sensor 125 is connected to the vapor port 133, and the other end of the fluid pump loop is equipped with a vapor connector 131 for connecting with the rack return manifold 103.

Figure 2:
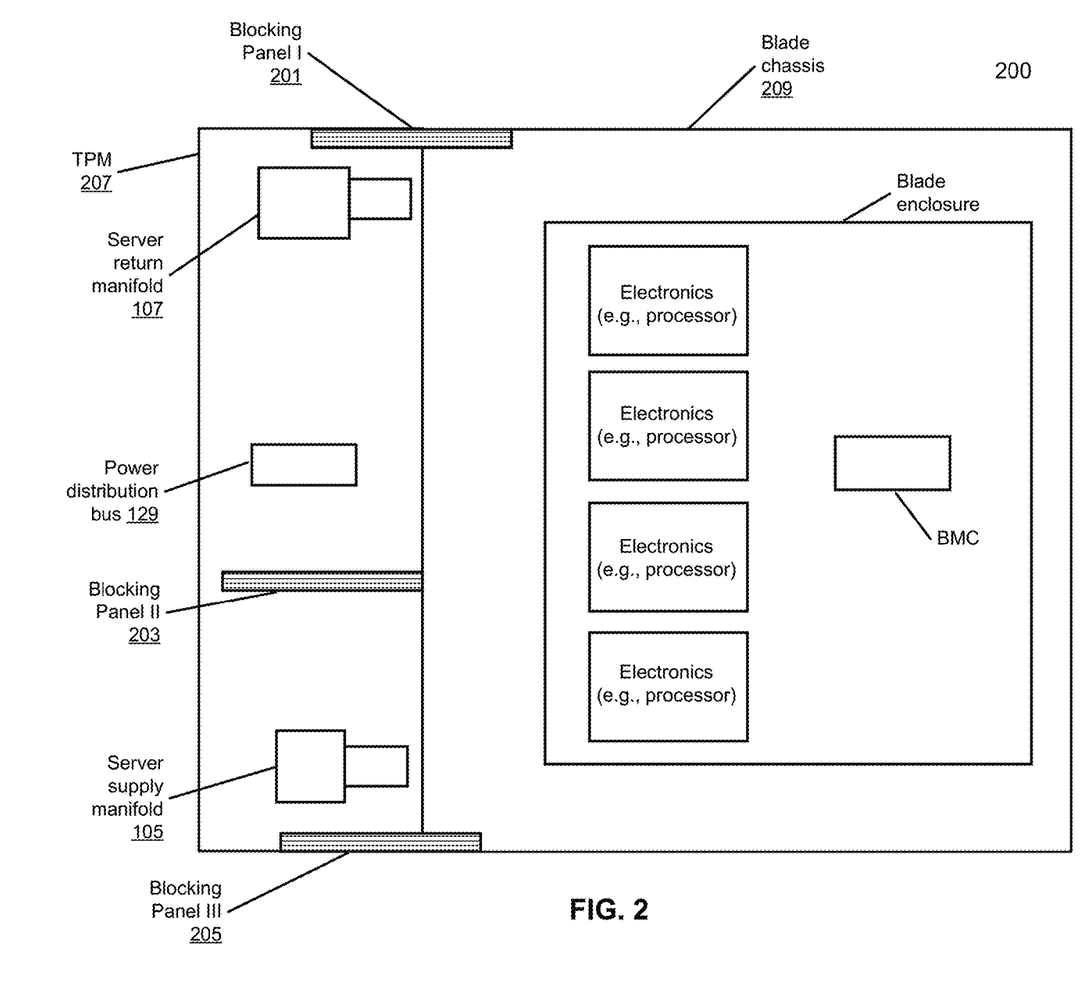
FIG. 2 shows a side view of a two-phase module design according to an embodiment of the application.

FIG. 2 shows a side view of a coolant management unit design 200 according to an embodiment of the application. In particular, FIG. 2 shows the design 200 including the coolant management unit and its key structural units for reliability enhancement. In an embodiment, the figure in FIG. 2 shows that the blocking panels (201, 203, 205) are used packaged on coolant management unit 207. In an embodiment, those panels (201, 203, 205) are designed for preventing impact from any leaked fluid. For example, since coolant management unit 207 will be installed on top of each other in a rack, the impact of the fluid leakage should be considered.

In an embodiment, the corresponding panel design enables a simple and effective solution for preventing potential fluid. For example, the blocking panel I 201 and III 203 are inserted into the blade chassis 209 and panel I 201 is used for preventing fluid from the top of systems and blocking panel II 203 is used for preventing the internal leaked fluid traveling outside. That is, each of the TPM (e.g., 207) provides a double protection on any potential leakage. In addition, there is a blocking panel II 203 added to the middle between the power distribution bus 129 and the liquid distribution supply 205. In an embodiment, this design is to enable a segregation of the power and liquid fluid. In an embodiment, there is no segregation between the vapor return manifold 103 and the power distribution bus 129, since the vapor may not cause damage to the power bus 129 even there is a leakage. That is, it can be seen that the blocking panel II 203 are used for preventing a large leakage such as a liquid splash from the connectors or connections between the connectors.

It can be seen that the block panels I 201 and III 205 can be customized for different blade servers and it can be used to create a fully contained environment of the TPM 207 and the corresponding blade servers.

In an embodiment, the server return manifold 107 is on top of the server supply manifold 105. In an embodiment, the power distribution bus 129 is positioned below the server return manifold 107. In an embodiment, the server supply manifold 105 is positioned below the power distribution bus 129.

In an embodiment, the coolant management unit 207 includes a first blocking panel 201, a second blocking panel 203 and a third blocking panel 205 to prevent impact from leaked fluid. In an embodiment, the first blocking panel 201 is on the top of the coolant management unit 207. In an embodiment, the first blocking panel 201 is inserted into the server chassis 209 to prevent the leaked fluid from the top. In an embodiment, the second blocking panel 203 is positioned between the power distribution bus 129 and the server supply manifold 105 to prevent a leakage from connectors. In an embodiment, the third blocking panel 205 is on the bottom of the coolant management unit 207. In an embodiment, the third blocking panel 205 is inserted into the server chassis 209 to prevent internal leaked fluid traveling outside.

Figure 3:
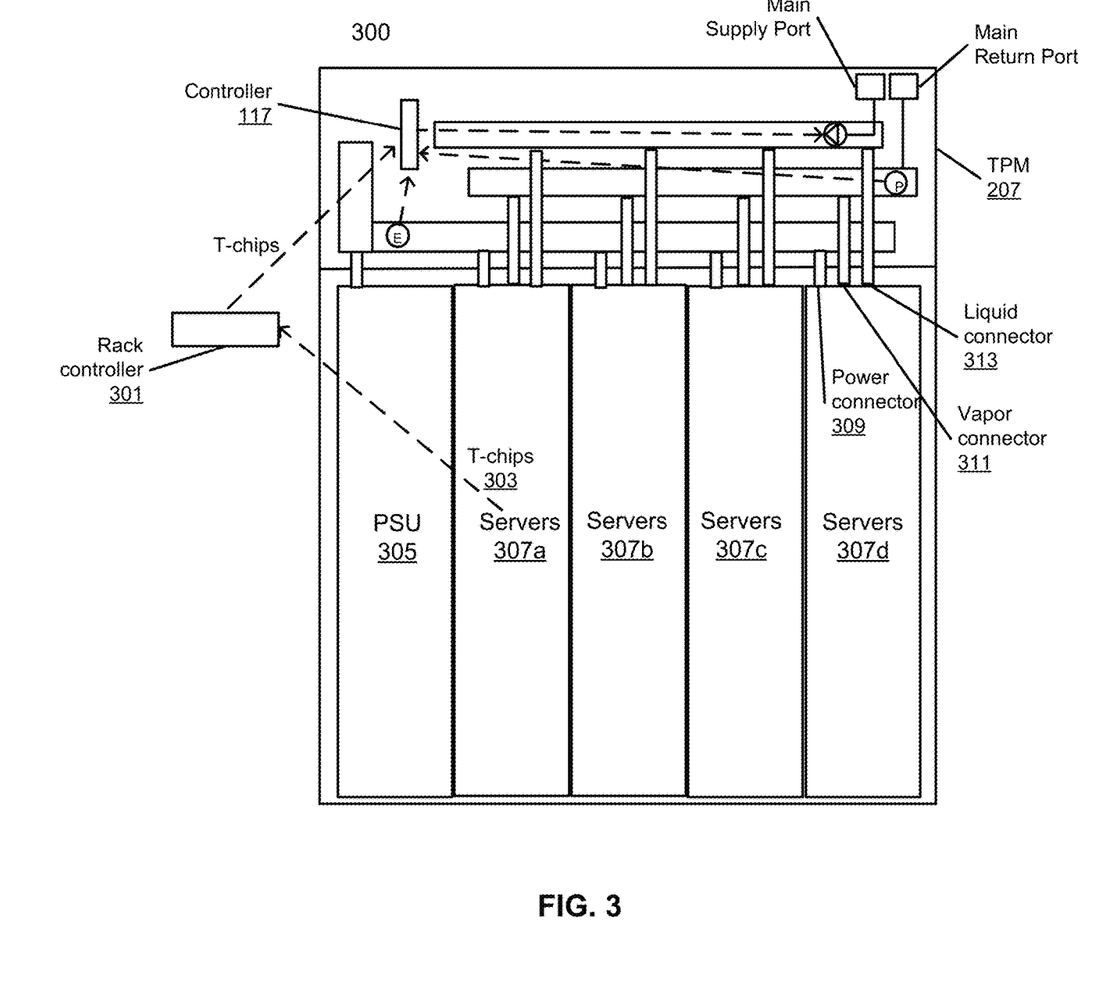
FIG. 3 shows a top view of a rack design according to certain embodiments of the application.

FIG. 3 shows a top view of a rack design 300 according to certain embodiments of the application. In particular, FIG. 3 shows the design of the TPM 207 in the rack functioning with the blade servers. In an embodiment, connections include the fluid connections, and power connections. The communication is designed using the rack controller 301, which is located in the rack. For example, the temperature sensors such as the ones measuring the chip temperature, T_chips 303 are sent to rack controller 301 through the server BMC. In an embodiment, the rack controller 301 communicates with individual coolant management unit controller (e.g., 117). In an embodiment, the design 300 is to ensure the T_chips 303 can be received by coolant management unit 207 in a certain control strategy design.

Each server blade would include a supply connector to connect with a corresponding server supply connector on the server supply manifold of the coolant management unit. Each server blade would include a return/vapor connector to connect with a corresponding server return connector on the server return manifold of the coolant management unit. Each server blade would include a power interface to connect with the power distribution bus of the coolant management unit to receive power. When a server blade is inserted into a server blade slot of a server chassis, these connectors will connect with the corresponding connectors of the coolant management unit, for example, automatically via blind mated and dripless connections.

In an embodiment, the power distribution bus includes power connectors 309 to connect with servers 307. In an embodiment, the server supply manifold includes liquid connectors 313 to connect with servers 307. In an embodiment, the server return manifold includes vapor connectors 311 to connect with servers 307.

In an embodiment, the liquid supply (i.e., rack supply manifold 101) and main return (i.e., rack return manifold 103) are located at the rear side of the TPM 207. These two units 101, 103 are added to the rack after the TPM 207 is added. The connection requires a liquid loop connection where the pump is on, and vapor loop connection where the vapor pressure is on.

In an embodiment, the one or more sensors include one or more temperature sensors to measure corresponding temperature of the server (e.g., 307*a*, 307*b*, 307*c*, 307*d*). In an embodiment, the controller 117 is coupled to a communication port connected with a rack management controller (RMC) 301. For example, the RMC 301 receives information of the corresponding server temperature from the controller 117.

Figure 4:
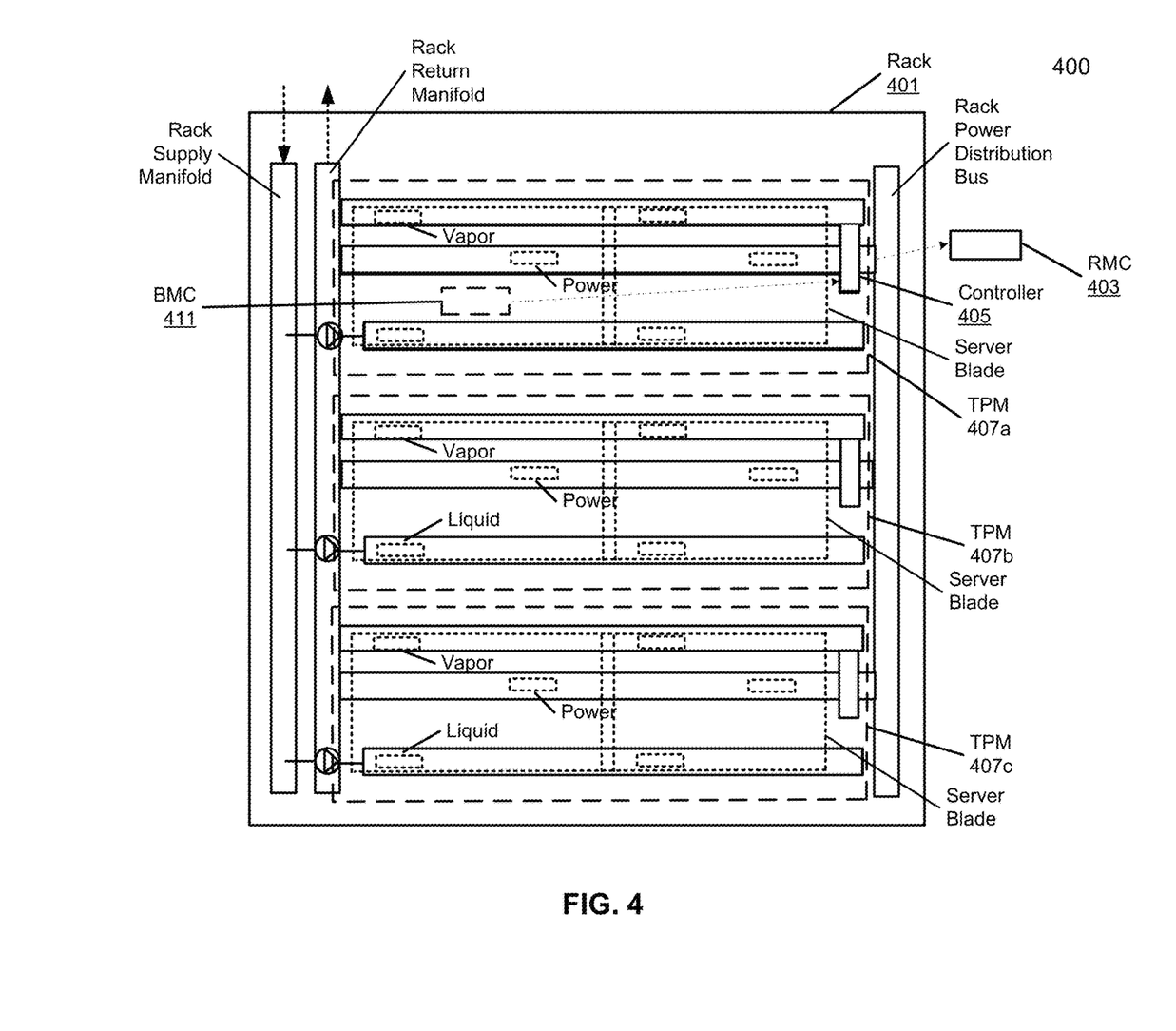
FIG. 4 shows a rear view of rack integration according to an embodiment of the application.

FIG. 4 shows a rear view of rack integration 400 according to an embodiment of the application. In particular, FIG. 4 shows a rack level design 400 with several blade servers installed. In an embodiment, the blade server includes vapor and liquid connections as well as the power connections. In addition, the server BMC 411 can communicate with the RMC 403 for the TPM controller 405 to be able to collect individual temperature information.

In an embodiment, several TPMs (e.g., 407*a*, 407*b*, 407*c*) are installed on the rack 401 and each of the TPM 407 is serving several blade servers. In an embodiment, the design 400 may be varying, since different TPM 407 can be used for different groups of servers as well as server configurations, on a same rack or different racks. Note that again, the terms of two-phase module or TPM and coolant management unit are interchangeable terms throughout this application.

Figure 5:
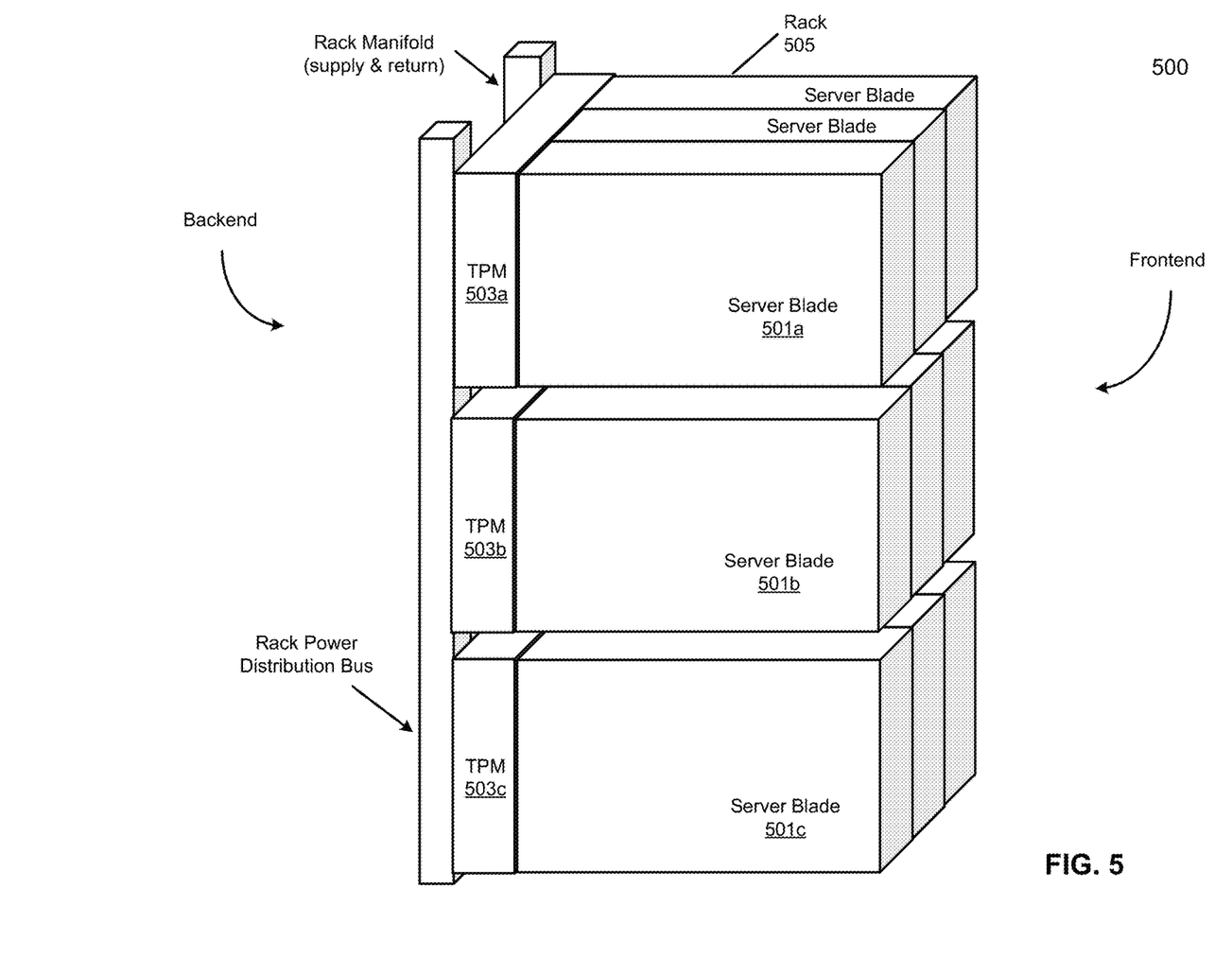
FIG. 5 shows a perspective view of a system according to an embodiment of the application.

FIG. 5 shows a perspective view of a system 500 according to an embodiment of the application. In particular, FIG. 5 shows that the rack 505 is populated with several groups of blade servers (501*a*, 501*b*, 501*c*) connected with their respective TPMs (503*a*, 503*b*, 503*c*). In an embodiment, each group of blade servers (501*a*, 501*b*, 501*c*) is functioning with a respective TPM 503. In an embodiment, the rack mounted fluid liquid supply and main return are added to the rear side of the racks once the TPMs (503*a*, 503*b*, 503*c*) are populated. In an embodiment, the detailed operation may enable the blade servers (501*a*, 501*b*, 501*c*) to be installed and uninstalled from the rack 505 without any impact on other systems.

In addition, a TPM unit 503 can be individually installed and uninstalled without any impact on the rack liquid supply and main return, since the connections are through flexible hoses. In an embodiment, the current design 500 enables an efficient control strategy on the fluid system since each of the individual TPM 503 are separately controlled. In an embodiment, even though multiple TPMs (503*a*, 503*b*, 503*c*) are sharing the rack liquid supply and main return manifolds, the individual controller (not shown) as well as the corresponding sensors input allows a robust localized control for groups of blade servers (501*a*, 501*b*, 501*c*).

Figure 6:
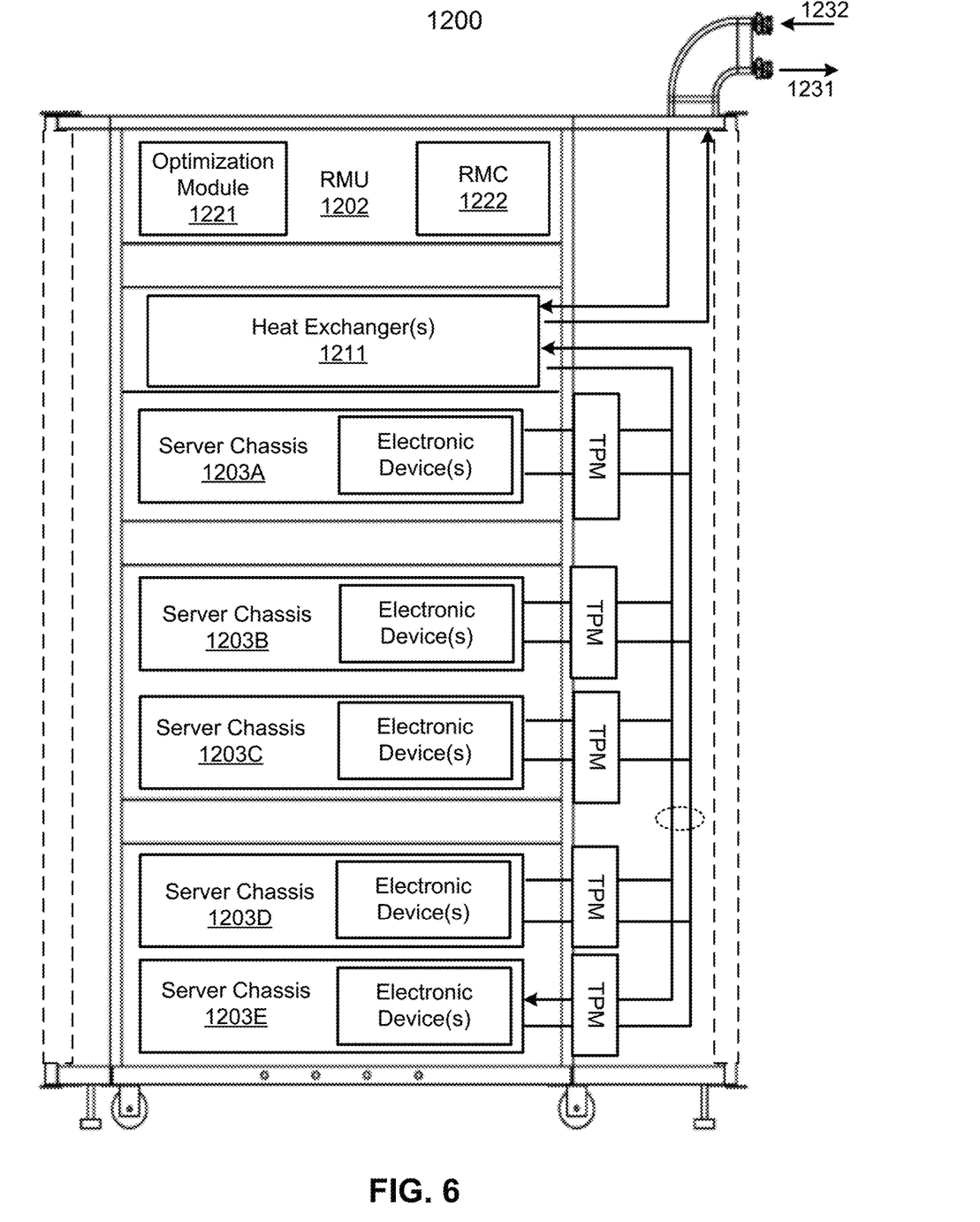
FIG. 6 is a block diagram illustrating an example of an electronic rack according to one embodiment.

FIG. 6 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Each server chassis may include one or more blade slots to receive one or more server blades. Each server blade represents one or more servers therein. For each of the server chassis, a TPM module is mounted in the rear end of the rack. When a server blade is inserted from the frontend, the liquid/vapor connectors and the power connector of the server blade can connect with the corresponding TPM module. The TPM module may be coupled to the rack manifold, for example, via flexible hoses, as described above.

Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backend of server chassis 1203 or on the electronic rack to generate airflows flowing from frontend 1204, traveling through the air space of the server chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate. The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the server chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A coolant management unit for liquid cooling, comprising:
   a server supply manifold to be coupled to a rack supply manifold to receive cooling fluid from a cooling fluid source, wherein the server supply manifold is to distribute the cooling fluid to one or more server blades of a server chassis of an electronic rack, wherein the coolant management unit is positioned on a rear side of the server chassis;
   a server return manifold to be coupled to a rack return manifold, wherein the server return manifold is to receive vapor from the one or more server blades, wherein the cooling fluid is two-phase cooling fluid to extract heat from one or more servers and to evaporate into the vapor into the server return manifold, wherein the vapor is transmitted to an external condenser via the rack return manifold to be condensed back to a liquid form;
   a power distribution bus to distribute power to the one or more servers; and
   a controller to control a fluid pump coupled to the server supply manifold based on one or more signals received from one or more sensors.

2. The coolant management unit of claim 1, wherein the one or more sensors include a pressure sensor coupled to the server return manifold to measure a pressure of vapor.

3. The coolant management unit of claim 2, wherein the pressure sensor is coupled with the server return manifold including a vapor connector for connecting with the rack return manifold.

4. The coolant management unit of claim 1, wherein the one or more sensors include a leakage sensor to detect leakage of the cooling fluid.

5. The coolant management unit of claim 1, wherein the one or more sensors include a power sensor coupled to the power distribution bus to detect power.

6. The coolant management unit of claim 1, further comprising a communication port to be connected with a rack management controller (RMC) of the electronic rack, wherein the controller is configured to communicate with the RMC via the communication port.

7. The coolant management unit of claim 6, wherein the controller receives server temperature information from the RMC.

8. The coolant management unit of claim 1, wherein the server supply manifold includes one or more liquid subports connected with corresponding liquid ports of the one or more server blades, and wherein the server return manifold includes a vapor port connected with the rack return manifold.

9. The coolant management unit of claim 1, wherein the power distribution bus is positioned between the server return manifold and the server supply manifold.

10. The coolant management unit of claim 1, further comprising a first blocking panel, a second blocking panel, and a third blocking panel to prevent impact from leaked fluid.

11. The coolant management unit of claim 10, wherein the first blocking panel is disposed on the top of the coolant management unit and inserted into the server chassis to prevent the leaked fluid from the top.

12. The coolant management unit of claim 10, wherein the second blocking panel is positioned between the power distribution bus and the server supply manifold to prevent a leakage from connectors.

13. The coolant management unit of claim 10, wherein the third blocking panel is on the bottom of the coolant management unit and inserted into the server chassis to prevent internal leaked fluid traveling outside.

14. A server chassis of an electronic rack, comprising:
   one or more server slots to receive one or more server blades; and
   a coolant management unit for providing liquid cooling to the server blades, the coolant management unit comprising:
      a server supply manifold to be coupled to a rack supply manifold to receive cooling fluid from a cooling fluid source, wherein the server supply manifold is to distribute the cooling fluid to the one or more server blades of the server chassis, wherein the coolant management unit is positioned on a rear side of the server chassis;

a server return manifold to be coupled to a rack return manifold, wherein the server return manifold is to receive vapor from the one or more server blades, wherein the cooling fluid is two-phase cooling fluid to extract heat from one or more servers and to evaporate into the vapor into the server return manifold, wherein the vapor is transmitted to an external condenser via the rack return manifold to be condensed back to a liquid form;

a power distribution bus to distribute power to the one or more servers; and a controller to control a fluid pump coupled to the server supply manifold based on one or more signals received from one or more sensors.

15. The server chassis of claim 14, wherein the one or more sensors include a pressure sensor coupled to the server return manifold.

16. The server chassis of claim 14, wherein the one or more sensors include a leakage sensor to detect leakage.

17. The server chassis of claim 14, wherein the one or more sensors include a power sensor coupled to the power distribution bus.

18. An electronic rack, comprising:

a plurality of server chassis arranged in a stack, each server chassis having one or more server slots to receive one or more server blades; and a plurality of coolant management units, each corresponding to one of the plurality of server chassis for connecting the server chassis to provide liquid cooling the one or more server blades of the corresponding server chassis, each coolant management unit comprising:

a server supply manifold to be coupled to a rack supply manifold to receive cooling fluid from a cooling fluid source, wherein the server supply manifold is to distribute the cooling fluid to the one or more server blades of the server chassis, wherein the coolant management unit is positioned on a rear side of the server chassis;

a server return manifold to be coupled to a rack return manifold, wherein the server return manifold is to receive vapor from the one or more server blades, wherein the cooling fluid is two-phase cooling fluid to extract heat from one or more servers and to evaporate into the vapor into the server return manifold, wherein the vapor is transmitted to an external condenser via the rack return manifold to be condensed back to a liquid form;

a power distribution bus to distribute power to the one or more servers; and a controller to control a fluid pump coupled to the server supply manifold based on one or more signals received from one or more sensors.

19. The electronic rack of claim 18, wherein the one or more sensors include a leakage sensor to detect leakage.

20. The electronic rack of claim 18, wherein the one or more sensors include a power sensor coupled to the power distribution bus.

* * * * *